United States Patent
Hiyoshi et al.

(10) Patent No.: US 10,468,358 B2
(45) Date of Patent: Nov. 5, 2019

(54) SEMICONDUCTOR DEVICE WITH METAL LAYER ALONG A STEP PORTION

(71) Applicant: Sumitomo Electric Industries, Ltd., Osaka-shi (JP)

(72) Inventors: Toru Hiyoshi, Osaka (JP); Taku Horii, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 15/677,544

(22) Filed: Aug. 15, 2017

(65) Prior Publication Data

US 2018/0019215 A1 Jan. 18, 2018

Related U.S. Application Data

(62) Division of application No. 14/712,354, filed on May 14, 2015, now Pat. No. 9,768,125.

(30) Foreign Application Priority Data

Jul. 10, 2014 (JP) ................................ 2014-142199

(51) Int. Cl.
*H01L 29/16* (2006.01)
*H01L 23/58* (2006.01)
(Continued)

(52) U.S. Cl.
CPC ........ *H01L 23/562* (2013.01); *H01L 21/0214* (2013.01); *H01L 21/0217* (2013.01); *H01L 21/02164* (2013.01); *H01L 21/0485* (2013.01); *H01L 21/32051* (2013.01); *H01L 21/78* (2013.01); *H01L 23/585* (2013.01); *H01L 29/0615* (2013.01); *H01L 29/0619* (2013.01);
(Continued)

(58) Field of Classification Search
CPC .. H01L 23/562; H01L 23/585; H01L 29/1608
USPC .................................................. 257/684, 730
See application file for complete search history.

(56) References Cited

U.S. PATENT DOCUMENTS

| 8,227,886 B2 * | 7/2012 | Takahashi | ......... H01L 27/14621 |
| | | | 257/440 |
| 2001/0016369 A1 * | 8/2001 | Zandman | .......... H01L 21/76898 |
| | | | 438/106 |

(Continued)

*Primary Examiner* — Robert T Huber
(74) *Attorney, Agent, or Firm* — Baker Botts L.L.P.; Michael A. Sartori

(57) ABSTRACT

A method of manufacturing a semiconductor device includes the steps of preparing a semiconductor layer including a wide bandgap semiconductor, the semiconductor layer having an element region and an outer peripheral region surrounding an outer periphery of the element region when viewed two-dimensionally, forming a step portion surrounding the outer periphery of the element region in the outer peripheral region, and forming a metal layer along the step portion. The step portion has a sidewall recessed downward from a main surface of the element region in a cross section parallel to a thickness direction of the semiconductor layer, and the metal layer extends to cover at least a portion of the sidewall. The method of manufacturing a semiconductor device further includes the step of dividing the semiconductor layer into the element regions on an outside of the step portion when viewed from the element region.

12 Claims, 15 Drawing Sheets

(51) Int. Cl.

| | | |
|---|---|---|
| *H01L 23/00* | (2006.01) | |
| *H01L 21/02* | (2006.01) | |
| *H01L 21/3205* | (2006.01) | |
| *H01L 21/78* | (2006.01) | |
| *H01L 29/20* | (2006.01) | |
| *H01L 29/78* | (2006.01) | |
| *H01L 21/04* | (2006.01) | |
| *H01L 29/66* | (2006.01) | |
| *H01L 29/739* | (2006.01) | |
| *H01L 29/06* | (2006.01) | |
| *H01L 21/56* | (2006.01) | |
| *H01L 23/31* | (2006.01) | |

(52) U.S. Cl.
CPC ...... *H01L 29/0638* (2013.01); *H01L 29/0661* (2013.01); *H01L 29/1602* (2013.01); *H01L 29/1608* (2013.01); *H01L 29/2003* (2013.01); *H01L 29/66068* (2013.01); *H01L 29/7395* (2013.01); *H01L 29/7811* (2013.01); *H01L 21/561* (2013.01); *H01L 23/3192* (2013.01); *H01L 2224/04042* (2013.01); *H01L 2224/05558* (2013.01); *H01L 2224/06181* (2013.01); *H01L 2224/94* (2013.01)

(56) References Cited

U.S. PATENT DOCUMENTS

| | | | |
|---|---|---|---|
| 2009/0289318 A1* | 11/2009 | Lin | H01L 27/14618 257/433 |
| 2012/0098121 A1* | 4/2012 | Chen | H01L 23/3171 257/737 |
| 2013/0062629 A1* | 3/2013 | Hiyoshi | H01L 21/3065 257/77 |
| 2015/0214355 A1* | 7/2015 | Nakano | H01L 29/41766 257/330 |

* cited by examiner

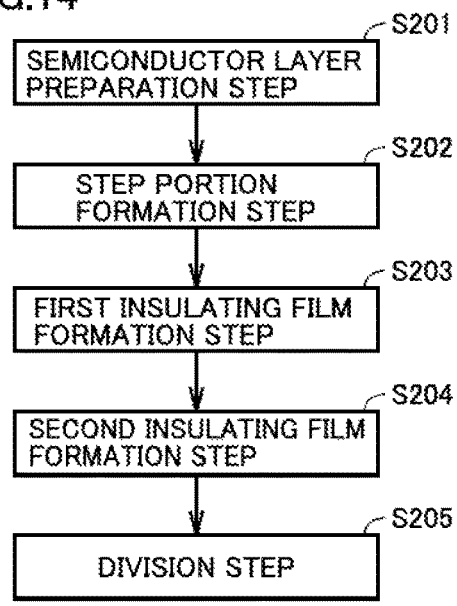
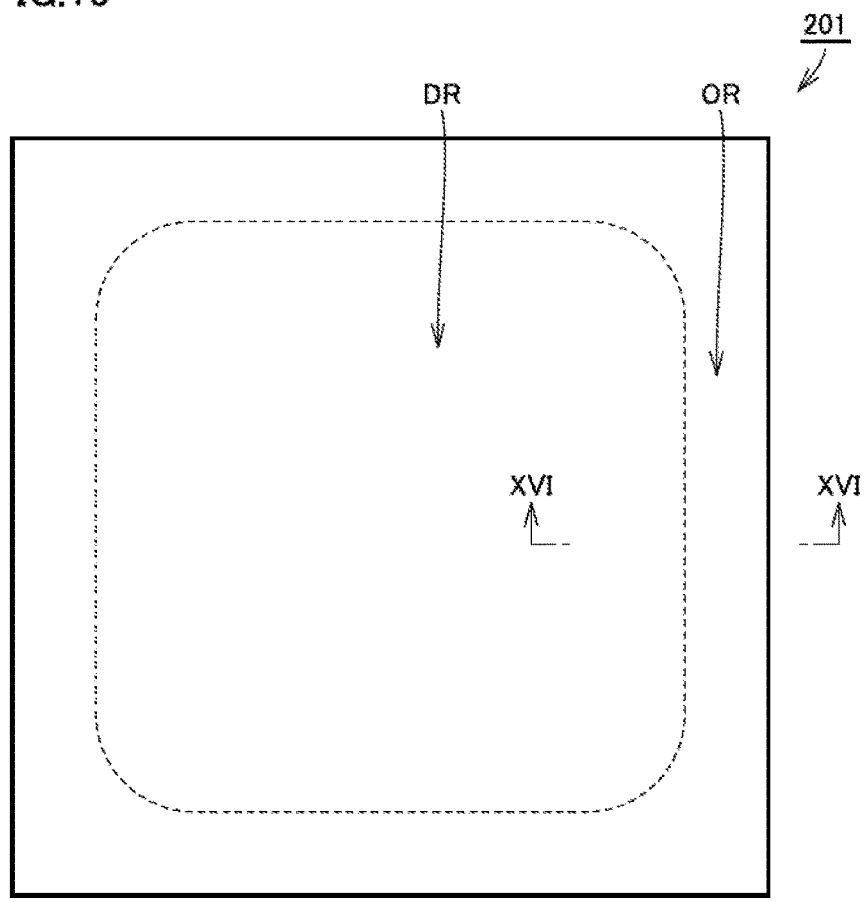

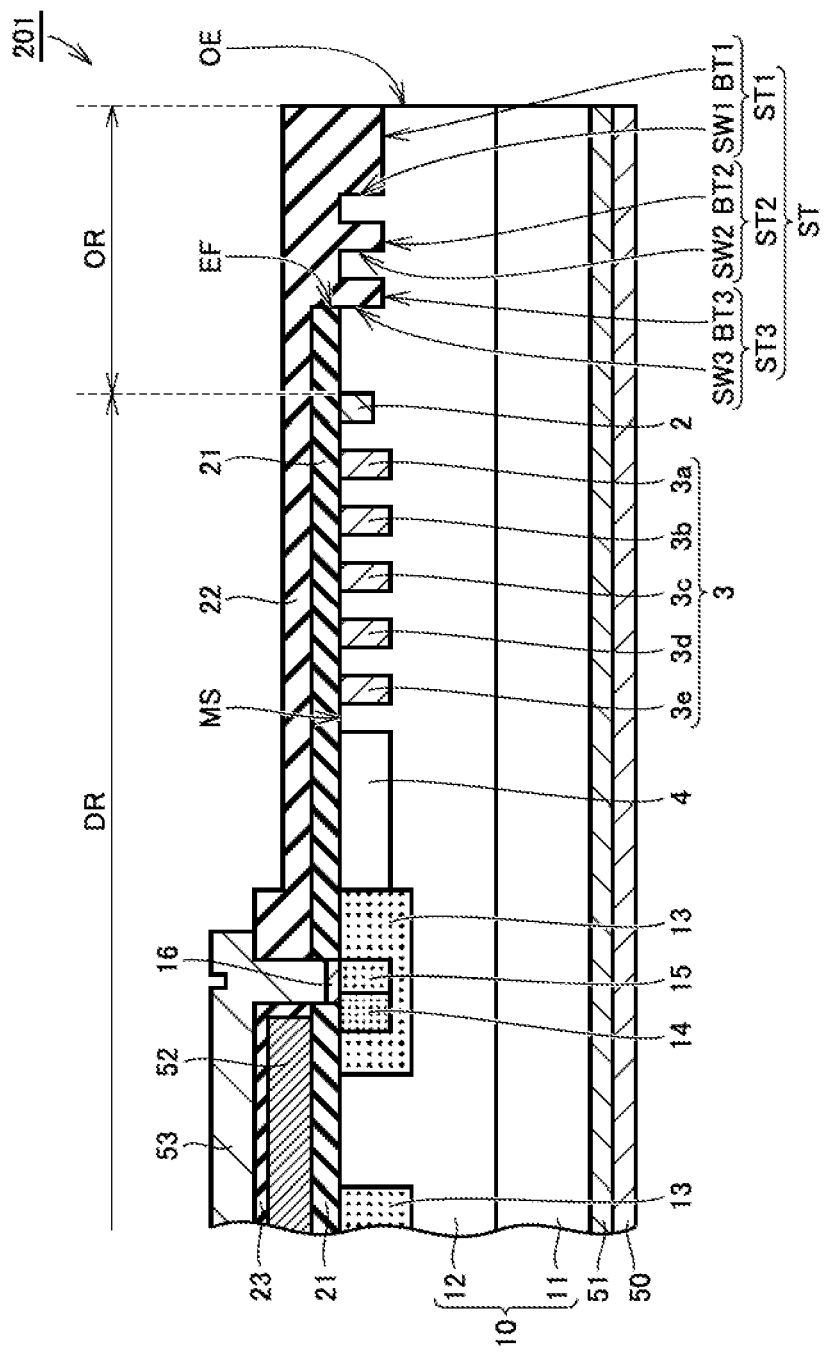

SEMICONDUCTOR DEVICE WITH METAL LAYER ALONG A STEP PORTION

CROSS-REFERENCE TO RELATED APPLICATIONS

This application is a Divisional of U.S. patent application Ser. No. 14/712,354, filed May 14, 2015, which claims the benefit of Japanese Patent Application No. 2014-142199, filed Jul. 10, 2014.

BACKGROUND OF THE INVENTION

Field of the Invention

The present invention relates to methods of manufacturing semiconductor devices and semiconductor devices.

Description of the Background Art

A wide bandgap semiconductor represented by silicon carbide (SiC) has recently attracted attention as a material for forming a semiconductor device. By using a wide bandgap semiconductor, a semiconductor device which is higher in breakdown voltage and lower in power consumption and is able to operate faster than a silicon (Si) semiconductor device can be expected.

In general, owing to a wide bandgap, a wide bandgap semiconductor has a high bonding force between atoms and extremely high hardness. Cracking and chipping thus tend to occur during dicing of a wafer into chips, which are a cause of lowering in yield. Various methods have been conventionally proposed for preventing such cracking and the like (see Japanese Patent Laying-Open No. 2008-60606, for example).

SUMMARY OF THE INVENTION

Japanese Patent Laying-Open No. 2008-60606 proposes a method of preventing cracking during dicing of a conventional Si substrate. In Japanese Patent Laying-Open No. 2008-60606, an opening is formed in a passivation film between a circuit formation region (an element region) and a dicing region (a dicing line). Consequently, according to Japanese Patent Laying-Open No. 2008-60606, machining stress during the dicing is less likely to propagate to the passivation film on the circuit formation region, thus preventing the occurrence of cracking in the circuit formation region.

In the case of a wide bandgap semiconductor substrate (a SiC substrate, for example) having hardness higher than the hardness of a Si substrate, however, cracking may occur not only in a passivation film but also in a semiconductor layer. The cracking that occurs in the semiconductor layer develops to hollow an element region and may damage the element region. In addition, when cracking occurs in the semiconductor layer on a dicing line and causes chipping in a portion of the semiconductor layer, chipping debris may scatter to damage the element region.

In view of the problem above, an object of the present invention is to reduce the occurrence of cracking and chipping that cause damage to an element region.

A method of manufacturing a semiconductor device according to one embodiment of the present invention includes the steps of preparing a semiconductor layer including a wide bandgap semiconductor, the semiconductor layer having an element region and an outer peripheral region surrounding an outer periphery of the element region when viewed two-dimensionally, forming a step portion surrounding the outer periphery of the element region in the outer peripheral region, and forming a metal layer along the step portion. The step portion has a sidewall recessed downward from a main surface of the element region in a cross section parallel to a thickness direction of the semiconductor layer, and the metal layer extends to cover at least a portion of the sidewall. The method of manufacturing a semiconductor device further includes the step of dividing the semiconductor layer into the element regions on an outside of the step portion when viewed from the element region.

A semiconductor device according to one embodiment of the present invention includes a semiconductor layer including a wide bandgap semiconductor, the semiconductor layer having an element region and an outer peripheral region surrounding an outer periphery of the element region when viewed two-dimensionally, a step portion formed in the outer peripheral region and surrounding the outer periphery of the element region, and a metal layer formed along the step portion. The step portion has a sidewall recessed downward from a main surface of the element region in a cross section parallel to a thickness direction of the semiconductor layer, and the metal layer extends to cover at least a portion of the sidewall.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 14 is a flowchart showing an overview of the third embodiment of the present invention.

FIG. 15 is a schematic plan view illustrating one example of a configuration of a semiconductor device according to a fourth embodiment of the present invention.

FIG. 16 is a schematic partial cross-sectional view along the line XVI-XVI in FIG. 15.

DESCRIPTION OF THE PREFERRED EMBODIMENTS

Figure 1:
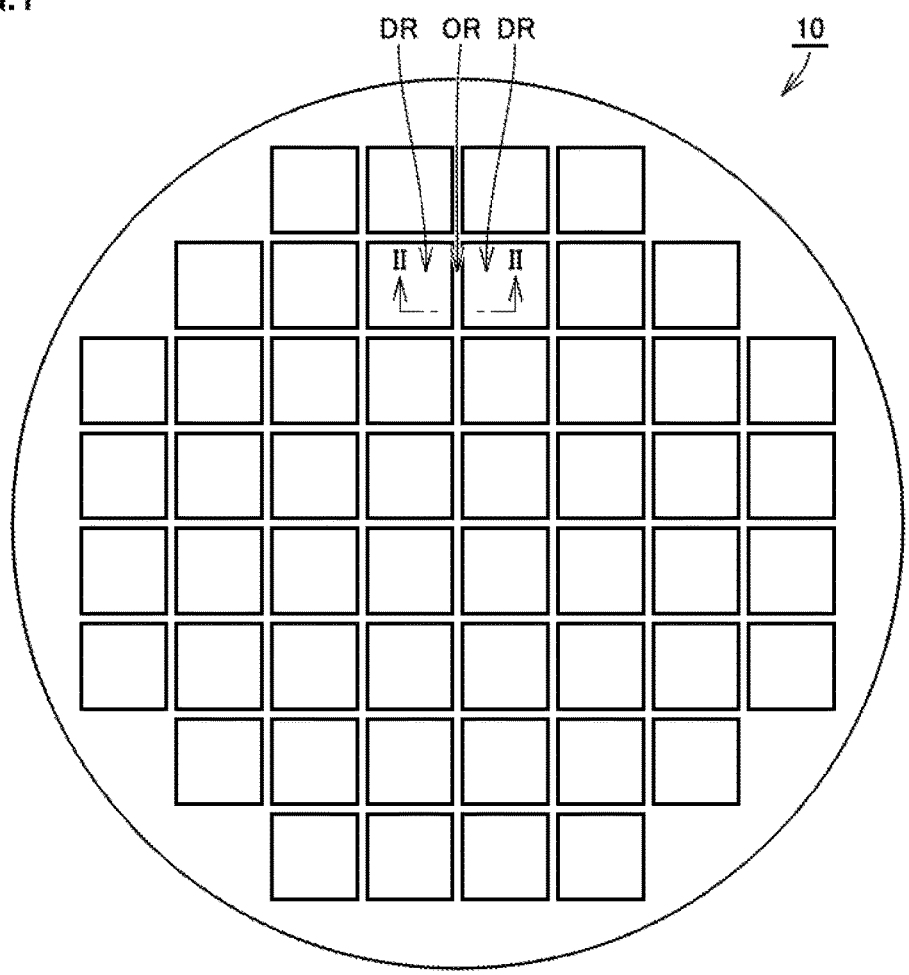
FIG. 1 is a schematic plan view illustrating a semiconductor layer preparation step according to a first embodiment of the present invention.

Description of Embodiments of the Present Invention

Embodiments of the present invention will be initially listed and described. In the following description, an "element region DR" indicates a portion ending with a field stop region 2 in a cross section of a semiconductor layer 10 (see FIG. 2, for example), and an "outer peripheral region OR" indicates a region outside of field stop region 2. The term "viewed two-dimensionally" indicates a view seen from a main surface MS of semiconductor layer 10 (see FIG. 1, for example).

[1] A method of manufacturing a semiconductor device according to one embodiment of the present invention includes the steps of preparing a semiconductor layer 10 including a wide bandgap semiconductor, the semiconductor layer having an element region DR and an outer peripheral region OR surrounding an outer periphery of element region DR when viewed two-dimensionally (S101), forming a step portion ST surrounding the outer periphery of element region DR in outer peripheral region OR (S102), and forming a metal layer 30 along step portion ST (S104). Step portion ST has a sidewall SW recessed downward from a main surface MS of element region DR in a cross section parallel to a thickness direction of semiconductor layer 10, and metal layer 30 extends to cover at least a portion of sidewall SW. The method of manufacturing a semiconductor device further includes the step of dividing semiconductor layer 10 into element regions DR on an outside of step portion ST when viewed from element region DR (S106).

In the above manufacturing method, step portion ST is formed in semiconductor layer 10 between element region DR and a portion where a dicing blade 80 makes contact with semiconductor layer 10 during dicing. Consequently, machining stress during the dicing tends to be concentrated on step portion ST due to the so-called "notch effect". That is, in the above manufacturing method, the portion where cracking and chipping tend to occur during the dicing is intentionally provided to thereby reduce the occurrence of cracking and chipping in the other portions (element region DR, for example).

Furthermore, in the above manufacturing method, metal layer 30 softer than semiconductor layer 10 is formed to cover at least a portion of sidewall SW of step portion ST. Consequently, soft metal layer 30 absorbs or lessens plastic deformation around step portion ST, thus reducing the occurrence and development of cracking. Moreover, even if chipping occurs in step portion ST, metal layer 30 overlying sidewall SW of step portion ST prevents the scattering of debris toward element region DR. According to the above manufacturing method, therefore, the occurrence of cracking and chipping that cause damage to element region DR can be reduced.

[2] Preferably, the above manufacturing method further includes the step of forming a first insulating film 21 on semiconductor layer 10 (S103), and in the step of forming a metal layer 30 (S104), metal layer 30 is formed to cover an end face EF of first insulating film 21.

By forming first insulating film 21 on semiconductor layer 10, element region DR can be mechanically and chemically protected. However, if first insulating film 21 is cut by the dicing to expose its end face EF, there is a probability that moisture will enter element region DR through end face EF and cause a loss of insulating property of element region DR. By forming metal layer 30 to cover end face EF, therefore, the entry of moisture through end face EF can be blocked to improve reliability of the semiconductor device.

[3] Preferably, in the above manufacturing method, the dividing step (S106) includes the step of dividing semiconductor layer 10 by a dicing blade 80, and step portion ST is a groove forming a dicing line W1 surrounding the outer periphery of element region DR and being wider than a dicing width W2 of dicing blade 80.

By setting the dicing line itself as a groove, that is, as step portion ST, the thickness of a portion of semiconductor layer 10 to be cut is reduced, thus decreasing the frequency of occurrence of cracking and chipping.

[4] Preferably, in the above manufacturing method, metal layer 30 includes at least one of aluminum (Al), titanium (Ti) and copper (Cu).

These metals can form a metal layer having appropriate hardness (softness), being dense and having excellent water vapor barrier property.

[5] Preferably, in the above manufacturing method, step portion ST further has a bottom BT continuous with sidewall SW, and metal layer 30 is formed to cover at least a portion of bottom BT.

With metal layer 30 covering at least a portion of bottom BT, the scattering of debris due to chipping or the entry of moisture can be more reliably suppressed.

[6] Preferably, in the above manufacturing method, the wide bandgap semiconductor includes silicon carbide (SiC), gallium nitride (GaN), aluminum nitride (AlN) or diamond.

According to the manufacturing method of [1] above, even during dicing of the semiconductor layer including these wide bandgap semiconductors having extremely high hardness, damage to element region DR due to cracking and chipping can be suppressed.

[7] Preferably, in the above manufacturing method, first insulating film 21 includes silicon dioxide ($SiO_2$).

$SiO_2$ has slightly low moisture resistance and has a probability of allowing moisture to permeate therethrough. If $SiO_2$ is used as first insulating film 21, therefore, moisture is more likely to enter element region DR therethrough, which may cause a loss of insulating property of the semiconductor device. According to the embodiment of [2] above, however, the entry of moisture through first insulating film 21 can be blocked, thus allowing the use of $SiO_2$ as first insulating film 21.

[8] Preferably, the above manufacturing method further includes the step of forming a second insulating film 22 on first insulating film 21 (S105), and second insulating film 22 includes at least one of silicon nitride (SiN) and silicon oxynitride (SiON).

By forming the insulating films as a two-layer structure, element region DR can be reliably protected. Moreover, by making the upper layer (second insulating film 22) of SiN and SiON having high moisture resistance, the entry of moisture into element region DR can be suppressed.

[9] Preferably, in the above manufacturing method, second insulating film 22 is formed to extend on an upper surface of metal layer 30. The scattering of debris due to chipping and the entry of moisture can thus be more reliably suppressed.

[10] Preferably, in the above manufacturing method, a plurality of the step portions are formed. Element region DR can thus be reliably protected against cracking and chipping.

[11] Preferably, in the above manufacturing method, end face EF of first insulating film 21 is located closer to element region DR than to step portion ST. Moisture is thus less likely to enter element region DR.

[12] One embodiment of the present invention also relates to a semiconductor device. The semiconductor device includes a semiconductor layer 10 including a wide bandgap semiconductor, the semiconductor layer having an element region DR and an outer peripheral region OR surrounding an outer periphery of element region DR when viewed two-dimensionally, a step portion ST formed in outer peripheral region OR and surrounding the outer periphery of element region DR, and a metal layer 30 formed along step portion ST. Step portion ST has a sidewall SW recessed downward from a main surface MS of element region DR in a cross section parallel to a thickness direction of semiconductor layer 10, and metal layer 30 extends to cover at least a portion of sidewall SW.

The above semiconductor device includes step portion ST and metal layer 30 in outer peripheral region OR. Thus, as was described in [1] above, damage to element region DR due to cracking and chipping can be suppressed during division of this semiconductor device from a wafer by dicing. Accordingly, this semiconductor device has high reliability and can be manufactured at a high yield.

[13] Preferably, the above semiconductor device further includes a first insulating film 21 formed on semiconductor layer 10, and metal layer 30 covers an end face EF of first insulating film 21.

By covering end face EF through which moisture tends to enter with metal layer 30, the moisture resistance of the semiconductor device can be increased.

[14] Preferably, in the above semiconductor device, an inner peripheral surface including sidewall SW is continuous with an outer peripheral end face OE of outer peripheral region OR.

Such a configuration is obtained by division of semiconductor device 10 with step portion ST as a dicing line. In this configuration, step portion ST formed so as to suppress the development of cracking and chipping is utilized as a dicing line. Thus, there is no need to provide a separate step portion in addition to the dicing line, so that the space can be effectively utilized. Furthermore, the thickness of a portion to be cut during the dicing is reduced, thus further decreasing the frequency of occurrence of cracking and chipping.

[15] Preferably, in the above semiconductor device, metal layer 30 includes at least one of aluminum (Al), titanium (Ti) and copper (Cu). A metal layer including these metals is dense and has excellent water vapor barrier property.

[16] Preferably, in the above semiconductor device, step portion ST further has a bottom BT continuous with sidewall SW, and metal layer 30 covers at least a portion of bottom BT. The moisture resistance of the semiconductor device can thus be further increased.

[17] Preferably, in the above semiconductor device, the wide bandgap semiconductor includes silicon carbide (SiC), gallium nitride (GaN), aluminum nitride (AlN) or diamond.

Since these wide bandgap semiconductors are extremely hard and prone to chipping, it has been difficult to manufacture a semiconductor device having high reliability at a high yield. The semiconductor device of [12] above, however, can be manufactured at a high yield and has high reliability while employing these wide bandgap semiconductors.

[18] Preferably, the above semiconductor device further includes a second insulating film 22 formed on first insulating film 21.

By forming the insulating films as a two-layer structure, element region DR can be reliably protected to further increase the moisture resistance of the semiconductor device.

[19] Preferably, in the above semiconductor device, first insulating film 21 includes silicon dioxide ($SiO_2$).

According to [13] above, the entry of moisture through first insulating film 21 can be blocked, thus allowing the use of $SiO_2$ having slightly low moisture resistance as first insulating film 21.

[20] Preferably, in the above semiconductor device, second insulating film 22 includes at least one of silicon nitride (SiN) and silicon oxynitride (SiON).

Since SiN and SiON have high moisture resistance, the use of these materials as second insulating film 22 can increase the moisture resistance of the semiconductor device.

[21] Preferably, in the above semiconductor device, end face EF of first insulating film 21 is located closer to element region DR than to step portion ST.

By locating end face EF of first insulating film 21 away from outer peripheral end face OE of outer peripheral region OR (that is, an outer peripheral end face of the semiconductor device), the moisture resistance of the semiconductor device can be increased.

[22] Preferably, in the above semiconductor device, second insulating film 22 extends on an upper surface of metal layer 30.

Consequently, the scattering of debris due to chipping and the entry of moisture can be more reliably suppressed.

[23] Preferably, the above semiconductor device includes a plurality of the step portions. Element region DR can thus be reliably protected against cracking and chipping.

DETAILS OF EMBODIMENTS OF THE PRESENT INVENTION

One embodiment (hereinafter also referred to as "the present embodiment") of the present invention will be described below in detail, however, the present embodiment is not limited thereto. In the following description, the same or corresponding elements are designated by the same characters and the same description thereof will not be repeated. Regarding crystallographic denotation herein, an individual orientation, a group orientation, an individual plane, and a group plane are shown in [ ], < >, ( ) and { }, respectively. Although a crystallographically negative index is normally expressed by a number with a bar "–" thereabove, a negative sign herein precedes a number to indicate a crystallographically negative index. A MOSFET (Metal Oxide Semiconductor Field Effect Transistor) is described as an example below, however, the present embodiment is not limited thereto and can be applied to an IGBT (Insulated Gate Bipolar Transistor), for example.

First Embodiment

Method of Manufacturing Semiconductor Device

Figure 9:
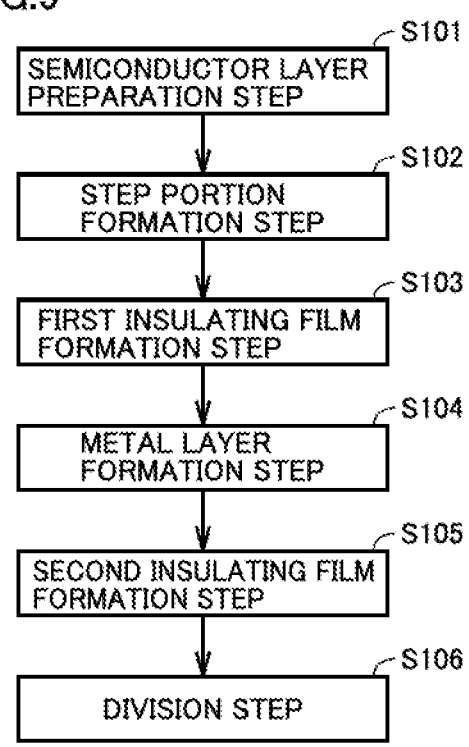
FIG. 9 is a flowchart showing an overview of the first embodiment of the present invention.

FIG. 9 is a flowchart showing an overview of a manufacturing method in the present embodiment. Referring to FIG. 9, this manufacturing method includes a semiconductor layer preparation step (S101), a step portion formation step (S102), a first insulating film formation step (S103), a metal layer formation step (S104), a second insulating film formation step (S105), and a division step (S106).

The sequence in which the step portion formation step (S102) and the first insulating film formation step (S103) are performed is not limited to that shown in FIG. 9. That is, the step portion formation step (S102) may be performed after the first insulating film formation step (S103). Each step will be described below.

Semiconductor Layer Preparation Step (S101)

In the semiconductor layer preparation step (S101), there is prepared a semiconductor layer 10 including a wide bandgap semiconductor and having an element region DR and an outer peripheral region OR surrounding an outer periphery of element region DR when viewed two-dimensionally.

FIG. 1 is a schematic plan view illustrating the semiconductor layer preparation step (S101). Referring to FIG. 1, in this step, element regions DR and outer peripheral region OR surrounding the outer peripheries of element regions DR when viewed two-dimensionally (FIG. 1) are formed in semiconductor layer 10 (a wafer at this point in time). In this step, element regions DR may be actually fabricated (formation of impurity regions, electrodes and the like), or portions that will become element regions DR and outer peripheral region OR may be simply determined. The fabrication of element regions DR may be carried out after the subsequently described step portion formation step (S102).

Figure 2:
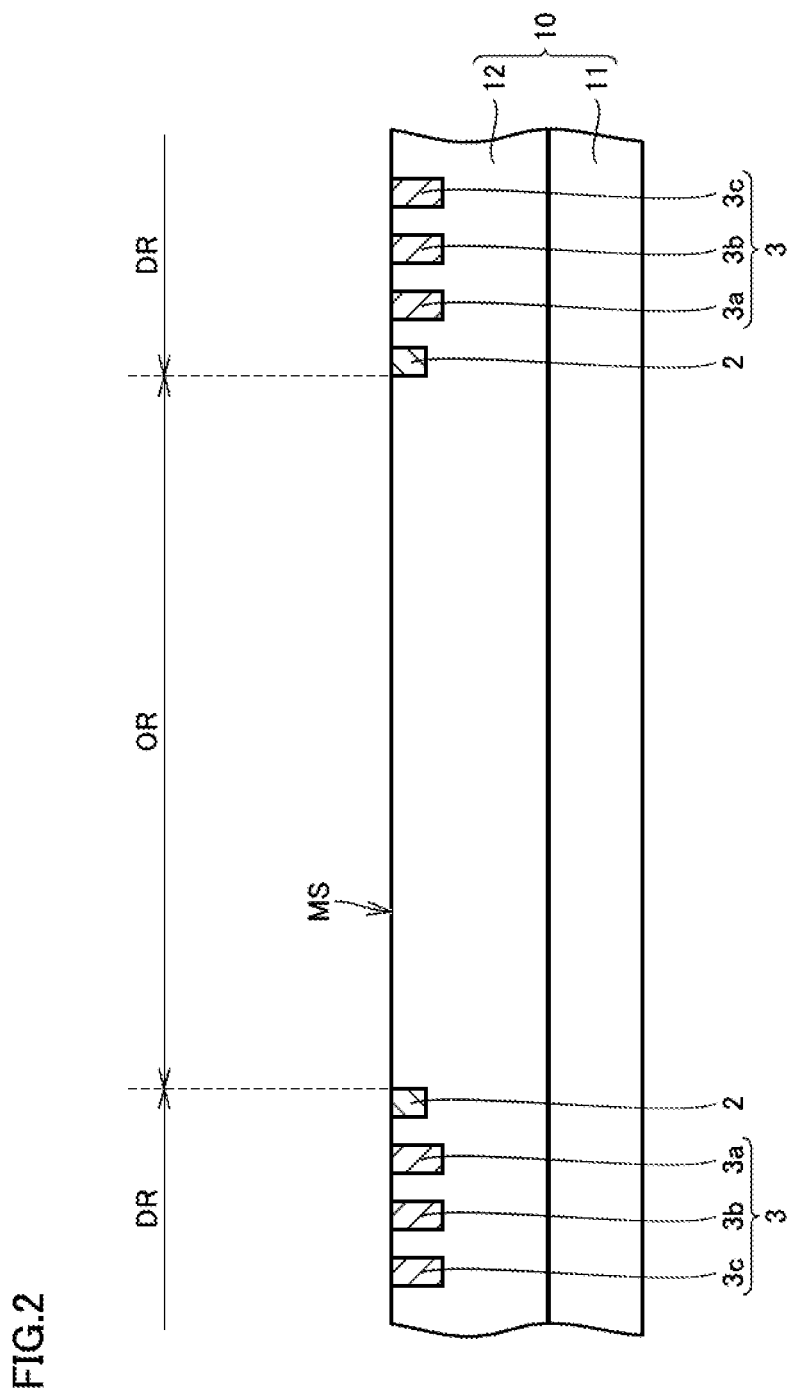
FIG. 2 is a schematic partial cross-sectional view along the line II-II in FIG. 1.

FIG. 2 is a schematic partial cross-sectional view along the line II-II in FIG. 1. Referring to FIG. 2, semiconductor layer 10 includes a single-crystal substrate 11, and an epitaxial layer 12 epitaxially grown thereon. In the present embodiment, single-crystal substrate 11 and epitaxial layer 12 are made of a wide bandgap semiconductor.

As used herein, the term "wide bandgap semiconductor" generally refers to a semiconductor having a bandgap of 2.0 eV or more. Examples of the semiconductors having such a bandgap include 4H—SiC (bandgap: approximately 3.3 eV), GaN (bandgap: approximately 3.4 eV), AlN (bandgap: approximately 6.2 eV), and diamond (bandgap: approximately 5.5 eV). As used herein, the term "4H—SiC" refers to a SiC single crystal having a polytype of 4H.

Single-crystal substrate 11 is prepared, for example, by slicing a single-crystal ingot. The single-crystal ingot may be sliced to a predetermined thickness by means of a wire saw, for example. If the intended semiconductor device is a power semiconductor device (a power device), single-crystal substrate 11 is preferably a 4H—SiC substrate so as to reduce on-resistance of the semiconductor device. Single-crystal substrate 11 also desirably has an off angle of not less than 1° and nor more than 8° relative to a {0001} plane so as to reduce the occurrence of basal plane dislocation and the like during the epitaxial growth.

Taking 4H—SiC as an example, epitaxial layer 12 can be grown on single-crystal substrate 11 by CVD (Chemical Vapor Deposition) using, for example, a mixed gas of silane ($SiH_4$) and propane ($C_3H_8$) as a source material gas. Here, epitaxial layer 12 may be doped with an impurity such as nitrogen (N) or phosphorous (P).

Then, ion implantation is performed through a mask that has been patterned by lithography or the like, to form subsequently described impurity regions, and a guard ring region 3 and a field stop region 2 surrounding the impurity regions. As mentioned above, in the present specification, field stop region 2 or a portion ending with field stop region 2 in semiconductor layer 10 is indicated as element region DR, and a region outside of element region DR is indicated as outer peripheral region OR.

Step Portion Formation Step (S102)

Figure 3:
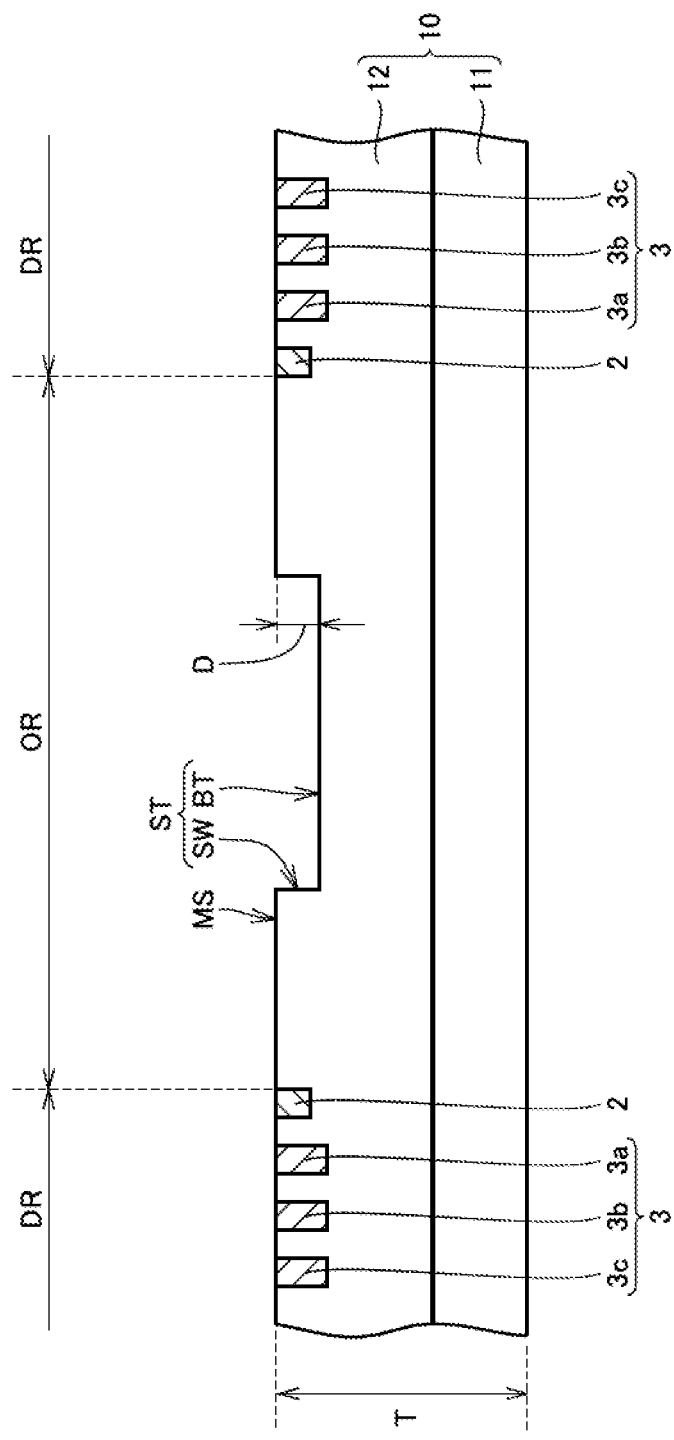
FIG. 3 is a schematic partial cross-sectional view illustrating a step portion formation step according to the first embodiment of the present invention.

In the step portion formation step (S102), a step portion ST surrounding the outer periphery of element region DR is formed in outer peripheral region OR. FIG. 3 is a schematic partial cross-sectional view illustrating the step portion formation step (S102). Referring to FIG. 3, step portion ST is formed to have a sidewall SW recessed downward from a main surface MS of semiconductor layer 10 in a thickness direction of semiconductor layer 10. As used herein, the term "downward" refers to a direction from main surface MS toward a surface located opposite to main surface MS in the thickness direction of semiconductor layer 10. Step portion ST is also formed to have a bottom BT which is continuous with sidewall SW and located in epitaxial layer 12. Step portion ST can be formed by removing a portion of semiconductor layer 10 by reactive ion etching (RIE), for example.

Step portion ST can be directly utilized as a dicing line. That is, step portion ST may be a grove forming a dicing line W1 which is wider than a dicing width W2 of a dicing blade 80 (see FIG. 7). In so doing, when dicing width W2 (the width of the dicing blade) is approximately between 50 and 80 µm, the width of step portion ST (the width of dicing line W1) is approximately between 100 and 145 µm, for example, preferably approximately between 100 and 135 µm, and more preferably approximately between 100 and 125 µm. Naturally, a dicing line can be set on main surface MS and a step portion may be formed separately from the dicing line. Such an embodiment is also covered by the present embodiment.

The cross-sectional shape of step portion ST is not limited to the shape shown in FIG. 3. For example, sidewall SW may be an oblique surface, and bottom BT may not be a surface parallel to main surface MS. In other words, the cross-sectional shape of step portion ST may be V-shaped or U-shaped, for example.

A depth D of step portion ST is preferably not less than approximately 0.1 µm and not more than approximately 10 µm. Damage to element region DR may not be adequately suppressed if depth D is less than 0.1 µm, and productivity may be lowered if it is more than 10 µm. Based on this point of view, depth D is more preferably not less than approximately 0.2 µm and not more than approximately 1 µm, and particularly preferably not less than approximately 0.2 µm and not more than approximately 0.5 µm.

First Insulating Film Formation Step (S103)

In the first insulating film formation step (S103), a first insulating film 21 is formed on semiconductor layer 10.

Figure 4:
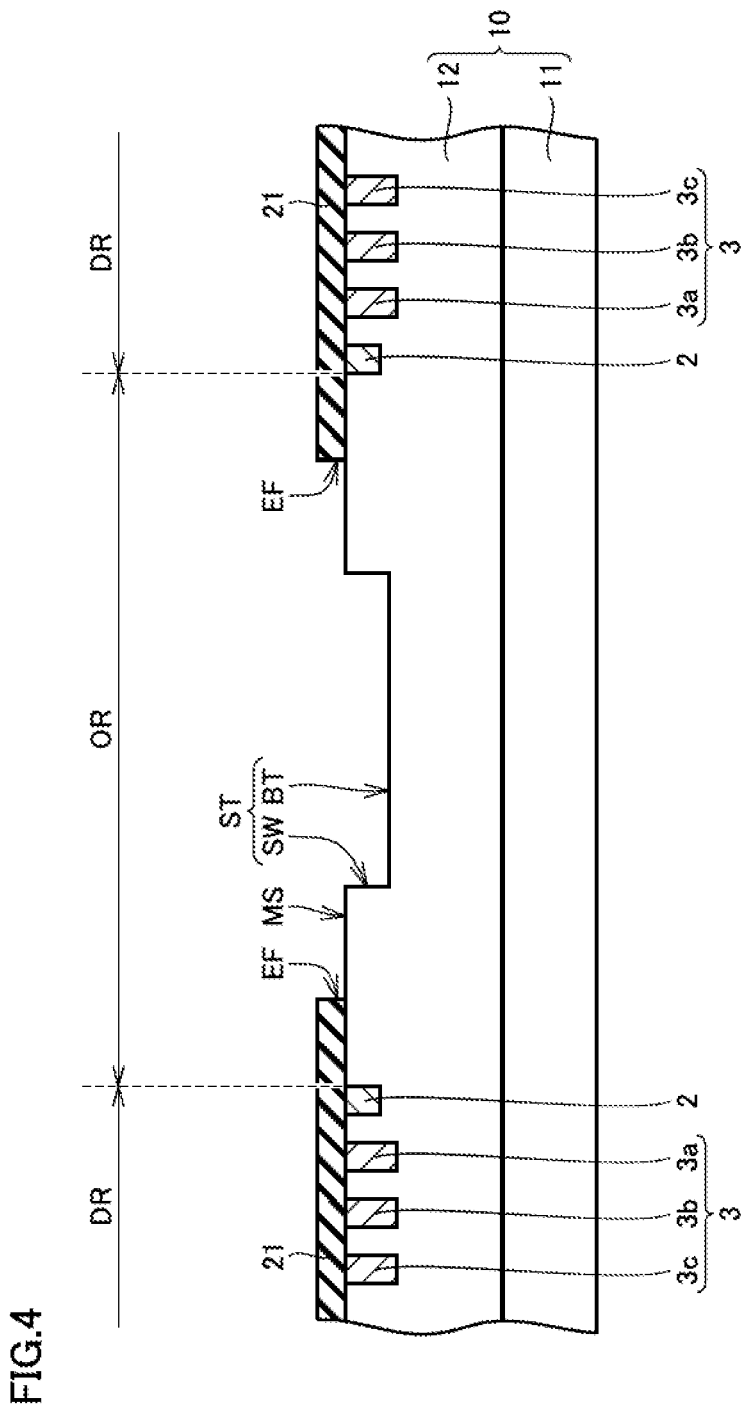
FIG. 4 is a schematic partial cross-sectional view illustrating a first insulating film formation step according to the first embodiment of the present invention.

FIG. 4 is a schematic partial cross-sectional view illustrating the first insulating film formation step (S103). Referring to FIG. 4, first insulating film 21 is formed to cover a surface of element region DR. The surface of element region DR can be protected by first insulating film 21. First insulating film 21 is a $SiO_2$ film, for example. A $SiO_2$ film can be formed by CVD, for example.

It is desirable that an end face EF of first insulating film 21 be exposed to air as little as possible. When end face EF is in contact with air, moisture permeates element region DR through end face EF, which may cause a loss of insulating property of element region DR. To prevent such a problem, first insulating film 21 may be formed such that end face EF of first insulating film 21 is located closer to element region DR than to step portion ST. By forming a metal layer 30 or a SiN film having high moisture resistance (a subsequently described second insulating film 22) to cover first insulating film 21 in this state, end face EF will not be exposed during dicing, whereby element region DR can be protected against moisture.

Metal Layer Formation Step (S104)

In the metal layer formation step (S104), metal layer 30 is formed along step portion ST when viewed two-dimensionally. That is, metal layer 30 is also formed to surround element region DR when viewed two-dimensionally.

Figure 5:
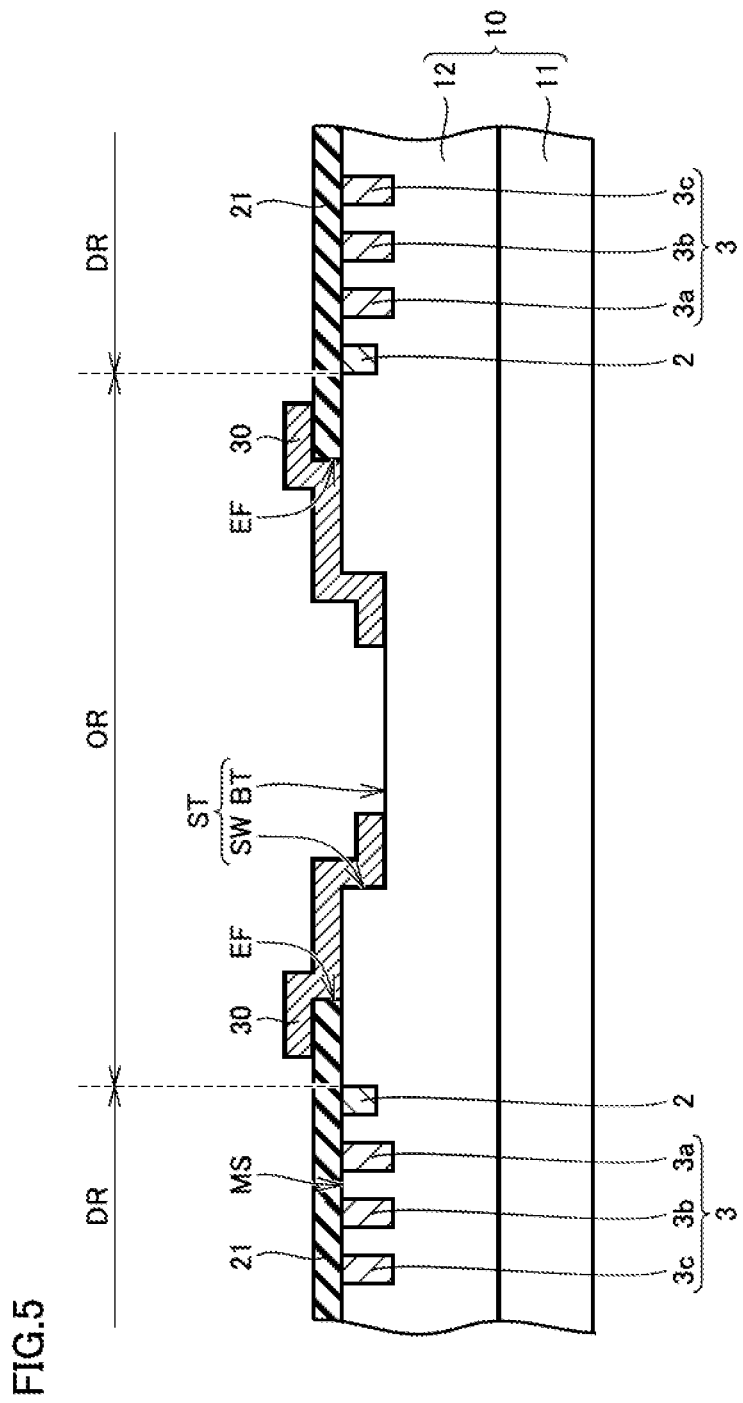
FIG. 5 is a schematic partial cross-sectional view illustrating a metal layer formation step according to the first embodiment of the present invention.

FIG. 5 is a schematic partial cross-sectional view illustrating the metal layer formation step (S104). Referring to FIG. 5, metal layer 30 is formed to cover a portion of main surface MS exposed at first insulating film 21, and at least a portion of sidewall SW of step portion ST. Consequently, even if chipping occurs in step portion ST, the scattering of debris can be prevented by metal layer 30 overlying thereon. Accordingly, metal layer 30 is more preferably formed to cover the entire sidewall SW.

Metal layer 30 can be formed by sputtering, for example. Metal layer 30 preferably includes at least one of Al, Ti and Cu. Metal layer 30 including these elements is softer than semiconductor layer 10 and can therefore absorb or lessen plastic deformation of a surrounding region. Metal layer 30 may be a single layer or may be constituted of a plurality of layers. For example, metal layer 30 may be a single Al layer, or may be constituted of an Al layer and a Cu layer stacked on each other. Metal layer 30 may also be formed of an alloy of Al and Cu. Cracking and chipping can thus be effectively suppressed in each case.

In addition, metal layer 30 is preferably formed to cover sidewall SW of step portion ST, and end face EF of first insulating film 21. Since metal layer 30 which is dense and has excellent water vapor barrier property covers end face EF of first insulating film 21, element region DR can be protected against moisture. Metal layer 30 is more preferably formed to extend on an upper surface of first insulating film 21. A pathway of entry of moisture can thus be more reliably blocked.

However, metal layer 30 desirably does not extend to a portion immediately above field stop region 2. There is a probability of an electric field being varied if metal layer 30 overlies the portion immediately above field stop region 2.

The thickness of metal layer 30 is not less than 1 μm and not more than 10 μm, for example. In consideration of the chipping suppressing function and the water vapor barrier function, the thickness of metal layer 30 is preferably not less than 2 μm and not more than 8 μm, and particularly preferably not less than 3 μm and not more than 7 μm.

Referring to FIG. 5, metal layer 30 may be formed to cover a portion of bottom BT of step portion ST. Consequently, the scattering of debris and the entry of moisture into element region DR can be more reliably suppressed. However, metal layer 30 desirably does not make contact with dicing blade 80 in the subsequently described division step (S106). Contact between metal layer 30 and dicing blade 80 is expected to cause problems such as the metal being melted and adhering to the cutting edge to thereby reduce the life of the dicing blade, or inability of a divided end face to be smooth. Based on this point of view, an overlying width W3 of metal layer 30 on step portion ST (FIG. 7) is preferably not less than 1 μm and not more than 20 μm, more preferably not less than 3 μm and not more than 18 μm, and particularly preferably not less than 5 μm and not more than 15 μm.

Second Insulating Film Formation Step (S105)

In the second insulating film formation step (S105), second insulating film 22 is formed on first insulating film 21.

Figure 6:
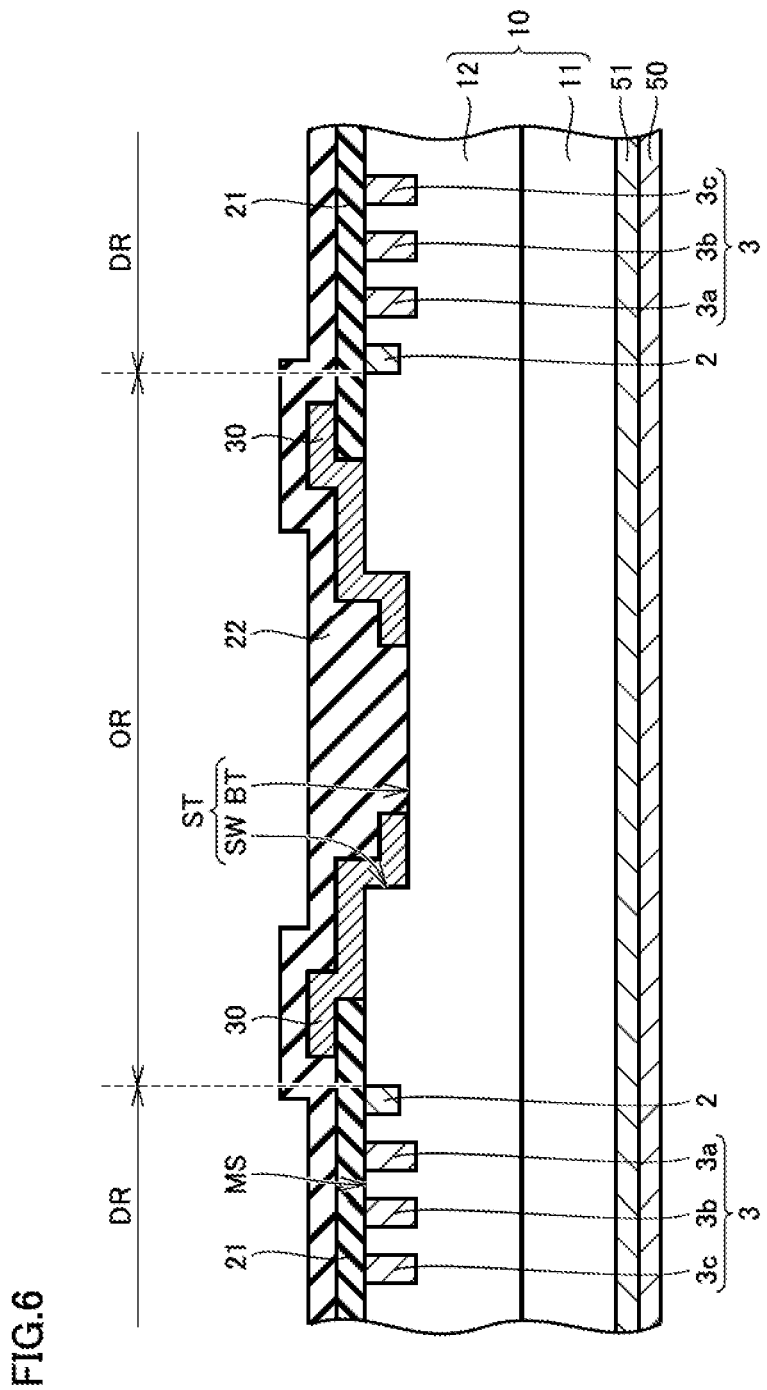
FIG. 6 is a schematic partial cross-sectional view illustrating a second insulating film formation step according to the first embodiment of the present invention.

FIG. 6 is a schematic partial cross-sectional view illustrating the second insulating film formation step (S105). Referring to FIG. 6, second insulating film 22 is formed to cover the upper surface of first insulating film 21, an upper surface of metal layer 30, and bottom BT of step portion ST. Consequently, the outer periphery of the semiconductor device can be reliably protected after the dicing (after the division).

Second insulating film 22 is desirably made of a material having high moisture resistance. By additionally covering metal layer 30 having water vapor barrier property with second insulating film 22 having high moisture resistance, moisture can be reliably blocked. Examples of such materials include SiN and SiON. A SiN film or SiON film can be formed by CVD, for example.

Then, a backside electrode may be formed on a backside surface (a surface located opposite to main surface MS). For example, after the backside surface is ground, an ohmic electrode 51 and a die bonding electrode 50 are stacked in this order on the backside surface. These electrodes can be formed by sputtering, for example. If single-crystal substrate 11 is a 4H—SiC substrate, then ohmic electrode 51 is a NiSi alloy, for example, and die bonding electrode 50 is a TiNiAu alloy, for example.

Division Step (S106)

In the division step (S106), semiconductor layer 10 is divided into element regions DR on an outside of step portion ST when viewed from element region DR.

Figure 7:
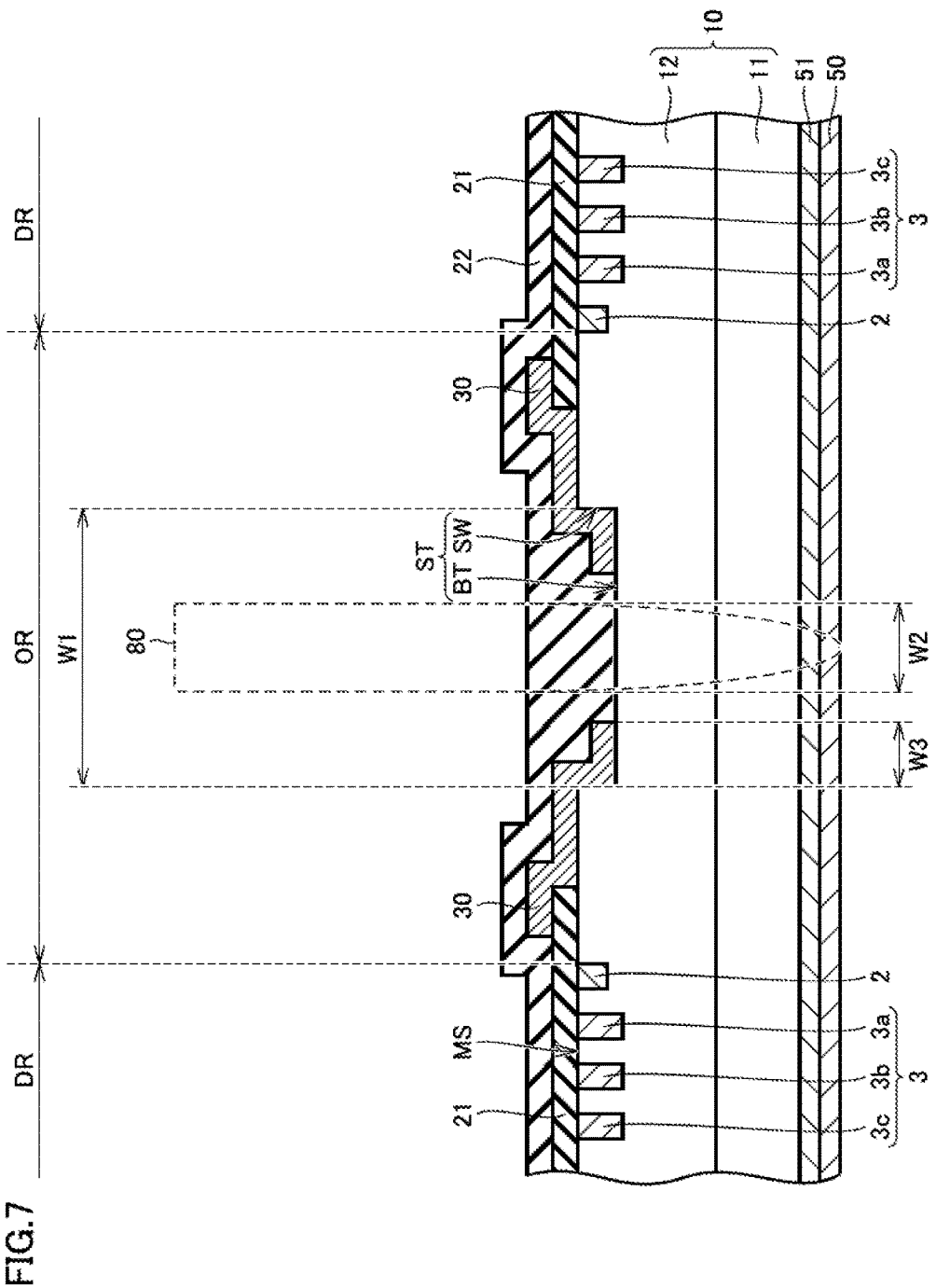
FIG. 7 is a schematic partial cross-sectional view illustrating a division step according to the first embodiment of the present invention.

FIG. 7 is a schematic partial cross-sectional view illustrating the division step (S106). Referring to FIG. 7, in the present embodiment, a corner portion of step portion ST (a portion where main surface MS and sidewall SW intersect with each other) corresponds to an end of dicing line W1. At the center of dicing line W1, dicing blade 80 cuts second insulating film 22, semiconductor layer 10 and the backside electrode. Semiconductor layer 10 is thus divided into element regions DR. A blade containing diamond abrasive grains at the cutting edge (a diamond blade), for example, can be used as dicing blade 80. In so doing, dicing blade 80 is desirably inserted in a position that does not make contact with metal layer 30.

In the present embodiment, machining stress from dicing blade 80 is concentrated on step portion ST due to the notch effect, and therefore, the occurrence of stress reaching into element region DR is reduced. That is, the occurrence of cracking that causes damage to element region DR is reduced. Furthermore, since plastic deformation around step portion ST is absorbed or lessened by soft metal layer 30, the development of micro cracks generated can be prevented. The scattering of debris due to chipping can also be prevented by metal layer 30. In the present embodiment, therefore, the dicing can be performed while damage to element region DR due to cracking and chipping is suppressed.

Variation

Figure 8:
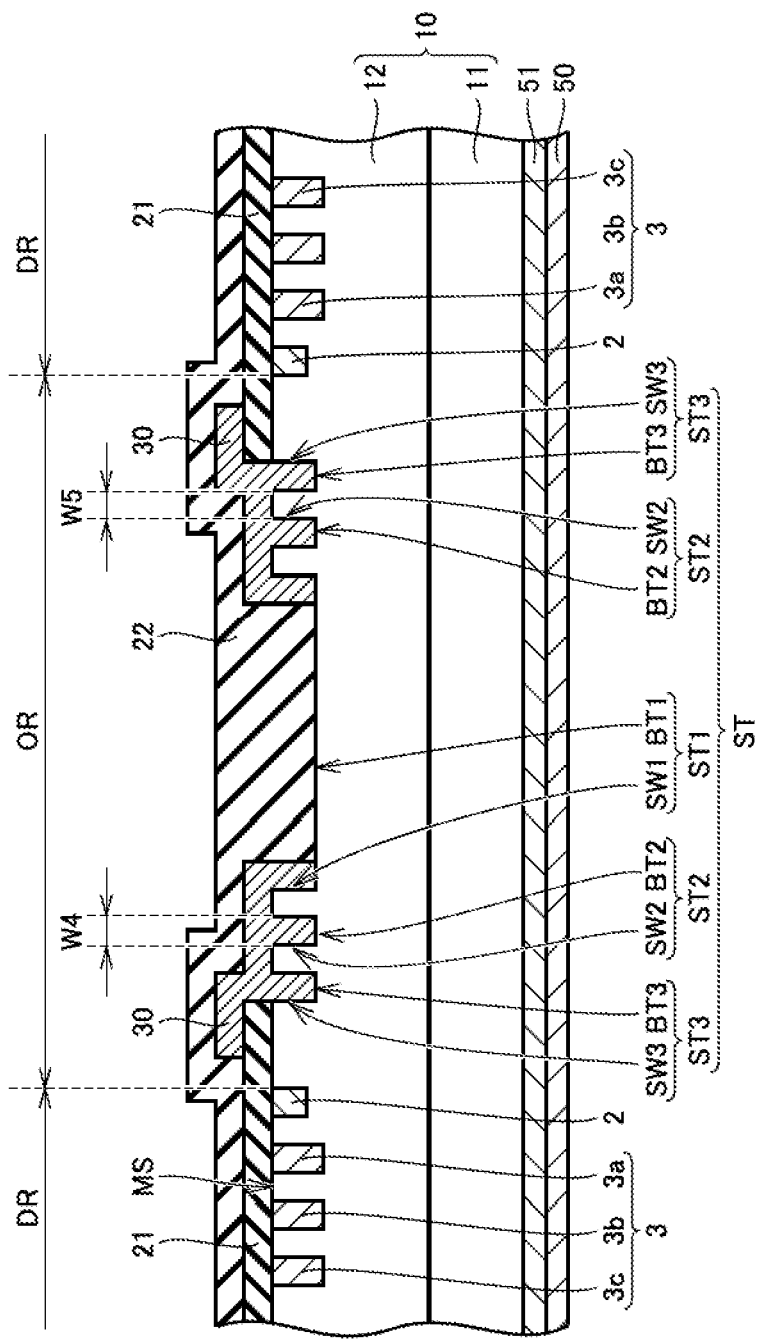
FIG. 8 is a schematic partial cross-sectional view illustrating a variation of the first embodiment of the present invention.

A variation of the first embodiment is now described. A plurality of step portions are formed in this variation. FIG. 8 is a schematic partial cross-sectional view illustrating this variation.

Referring to FIG. 8, in this variation, the groove forming the dicing line serves as a first step portion ST1, and a second step portion ST2 and a third step portion ST3 are additionally formed inside of first step portion ST1 (close to element region DR). Each step portion is formed to surround element region DR when viewed two-dimensionally. In addition, metal layer 30 is formed to cover at least a portion of sidewalls SW1 to SW3 of the step portions. By providing the plurality of step portions in this manner, the occurrence of cracking that reaches element region DR or the occurrence of serious chipping (debris) can be more reliably reduced. The number of step portions is not particularly limited and may be changed as appropriate depending on the specifications of the semiconductor device. However, in consideration of the space of element regions DR or the number of element regions DR that can be obtained from the wafer, a maximum number is preferably about ten.

As with the cross-sectional shape of previously described step portion ST, the cross-sectional shapes of second step portion ST2 and third step portion ST3 are not particularly limited, either, and may be V-shaped or U-shaped. In addition, second step portion ST2 and third step portion ST3 not forming the dicing line may have the entire sidewalls and bottoms covered with metal layer 30. Moreover, in this configuration, first step portion ST1 forming the dicing line is not essential.

The width of the step portions not forming the dicing line (second step portion ST2 and third step portion ST3) (a width W4 of the groove) is not less than approximately 2 μm and not more than approximately 10 μm, for example. A space W5 between adjacent step portions is not less than 2 μm and not more than 10 μm, for example, preferably not less than 3 μm and not more than 7 μm, and particularly preferably not less than 4 μm and not more than 6 μm. By defining the width of the groove and the space as described above, the frequency of occurrence of cracking and the like can be further decreased.

Second Embodiment

Semiconductor Device

Figure 10:
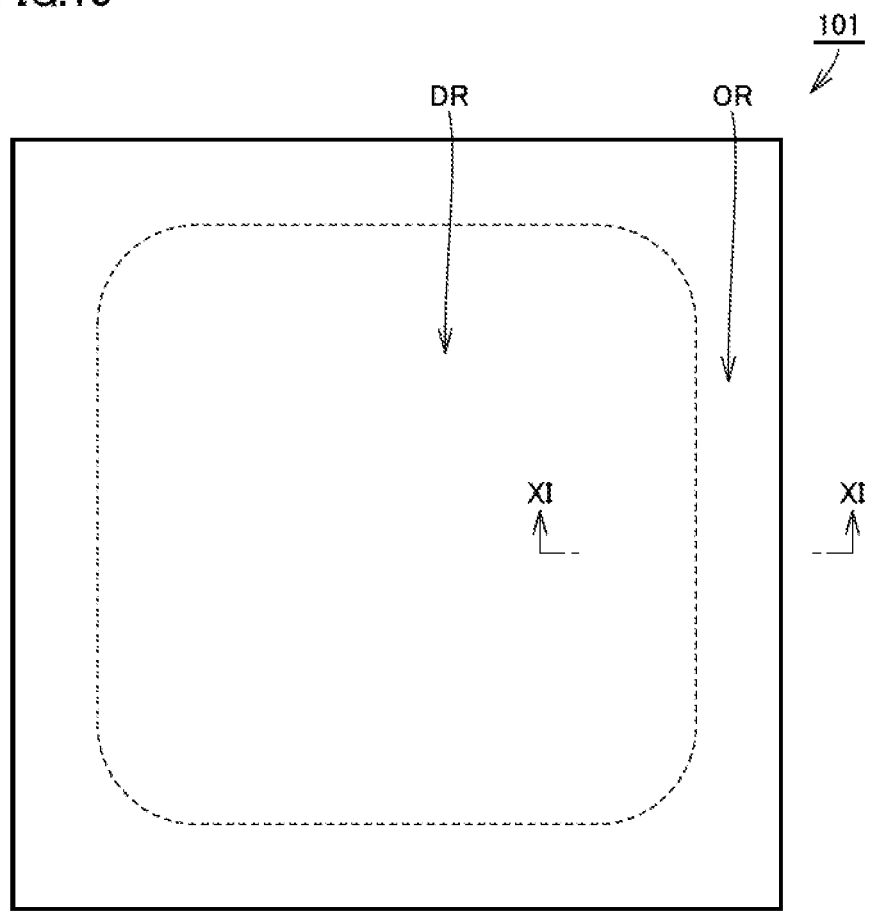
FIG. 10 is a schematic plan view illustrating one example of a configuration of a semiconductor device according to a second embodiment of the present invention.
Figure 11:
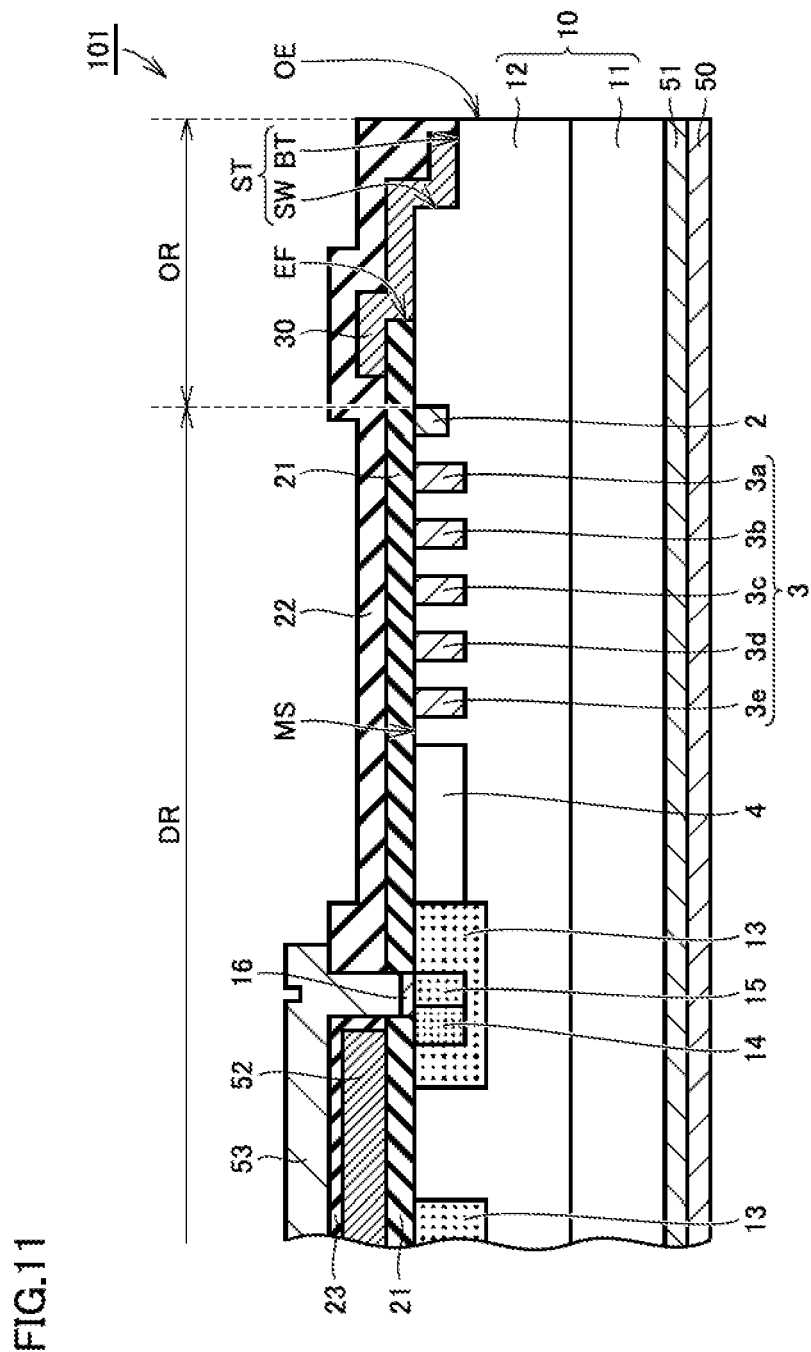
FIG. 11 is a schematic partial cross-sectional view along the line XI-XI in FIG. 10.

FIG. 10 is a schematic plan view illustrating one example of a configuration of a semiconductor device according to the present embodiment, and FIG. 11 is a schematic partial cross-sectional view along the line XI-XI in FIG. 10. Referring to FIGS. 10 and 11, a semiconductor device 101 includes semiconductor layer 10 including a wide bandgap semiconductor and having element region DR and outer peripheral region OR surrounding the outer periphery of element region DR when viewed two-dimensionally (FIG. 10). In outer peripheral region OR, there are formed step portion ST surrounding the outer periphery of element region DR, and metal layer 30 along step portion ST.

In a cross section parallel to the thickness direction of semiconductor layer 10 (FIG. 11), step portion ST has sidewall SW recessed downward from main surface MS of element region DR, and metal layer 30 extends to cover at least a portion of sidewall SW.

Semiconductor device 101 can be manufactured with the manufacturing method described in the first embodiment. Semiconductor device 101 can thus be manufactured while damage to element region DR due to cracking and chipping is suppressed. Accordingly, semiconductor device 101 has high reliability and can be manufactured at a high yield.

Referring now to FIG. 11, in semiconductor device 101, an inner peripheral surface of step portion ST (sidewall SW and bottom BT) is continuous with an outer peripheral end face OE of outer peripheral region OR. This shows that step portion ST was originally a groove forming a dicing line. That is, semiconductor device 101 is obtained by cutting and dividing a thin portion of semiconductor layer 10 using step portion ST as a dicing line. Therefore, it can be said that semiconductor device 101 has a decreased frequency of occurrence of cracking and chipping during the dicing and has improved reliability.

Referring back to FIG. 11, semiconductor layer 10 includes single-crystal substrate 11 and epitaxial layer 12. Epitaxial layer 12 functions as an electron drift layer. A portion of epitaxial layer 12 which is included in element region DR has various doped regions (field stop region 2, guard ring region 3, a JTE region 4, a body region 13, a source region 14, a P⁺ region 15) formed therein. Guard ring region 3 is constituted of a plurality of guard ring portions 3a to 3e.

On main surface MS of semiconductor layer 10, first insulating film 21 is formed to extend from element region DR to outer peripheral region OR. First insulating film 21 has an opening in element region DR, with a source electrode 16 being formed in the opening. A pad electrode 53 is connected to source electrode 16.

First insulating film 21 functions as a gate insulating film on an inner peripheral side relative to source electrode 16. A gate electrode 52 is formed on the gate insulating film. An interlayer insulating film 23 is formed to cover gate electrode 52, and insulates gate electrode 52 from source electrode 16 and pad electrode 53.

On the backside surface (the surface of semiconductor layer 10 located opposite to main surface MS), ohmic electrode 51 and die bonding electrode 50 are stacked in this order to form a drain electrode. In this manner, semiconductor device 101 has a vertical MOSFET structure, and is high in breakdown voltage, low in power consumption and is able to operate fast based on the properties of a wide bandgap semiconductor.

In the present embodiment, SiC, GaN, AlN or diamond, for example, can be employed for the wide bandgap semiconductor. Problems resulting from the hardness of semiconductor layer 10 can thus be prevented by step portion ST and metal layer 30.

In semiconductor device 101, first insulating film 21 is a $SiO_2$ film, for example. A $SiO_2$ film has slightly low moisture resistance and has a probability of allowing moisture to permeate therethrough. In semiconductor device 101, therefore, end face EF of first insulating film 21 is located closer to element region DR than to step portion ST. By locating end face EF away from outer peripheral end face OE of outer peripheral region OR, moisture is less likely to enter the structure.

Moreover, in semiconductor device 101, metal layer 30 is formed to cover end face EF of first insulating film 21. Since such metal layer 30 which is dense and has excellent water vapor barrier property covers end face EF, the entry of moisture through end face EF can be reliably blocked.

Metal layer 30 preferably includes at least one of Al, Ti and Cu, since these metals have excellent water vapor barrier property. Metal layer 30 may be a single layer or may be constituted of a plurality of layers. For example, metal layer 30 may be a single Al layer, or may be constituted of an Al layer and a Cu layer stacked on each other. Metal layer 30 may also be formed of an alloy of Al and Cu. Moisture can thus be blocked in each case.

Metal layer 30 desirably contains a metallic element constituting pad electrode 53 and a metal wire (not shown) connected to thereto. This allows metal layer 30 to be formed simultaneously with pad electrode 53 and the like, thereby simplifying the process.

Metal layer 30 may cover a portion of bottom BT of step portion ST. Moisture can thus be more reliably blocked.

Semiconductor device 101 further includes second insulating film 22 formed on first insulating film 21. Second insulating film 22 can suppress the entry of moisture through the upper surface of first insulating film 21. Second insulating film 22 is a SiN film or a SiON film, for example, since these materials have high moisture resistance.

Second insulating film 22 preferably extends to the upper surface of metal layer 30. The entry of moisture through end face EF of first insulating film 21 can thus be more reliably suppressed. Based on a similar point of view, second insulating film 22 is desirably continuous with outer peripheral end face OE of outer peripheral region OR.

Variation

Figure 12:
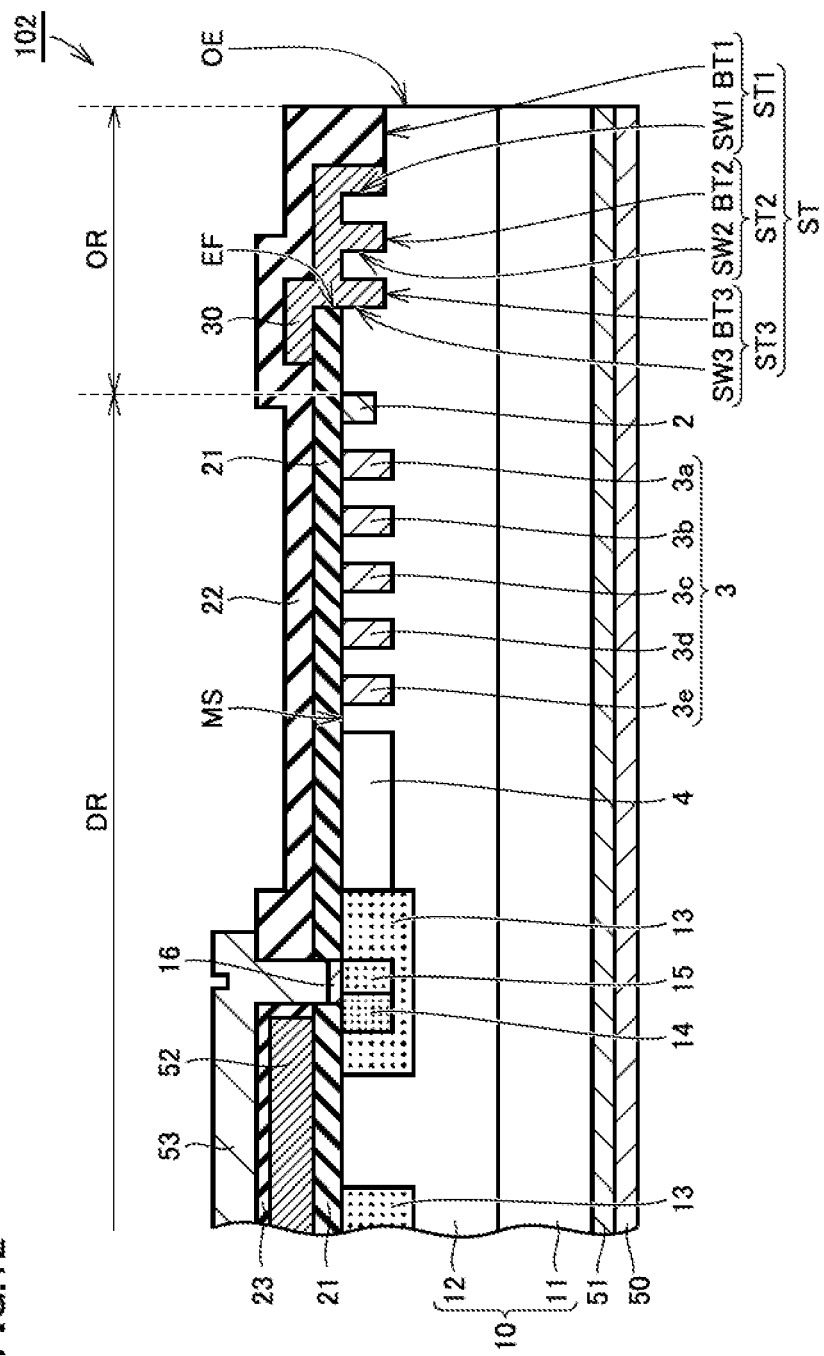
FIG. 12 is a schematic partial cross-sectional view illustrating a variation of the second embodiment of the present invention.

A variation of the second embodiment is now described. A semiconductor device 102 according to this variation includes a plurality of step portions. FIG. 12 is a schematic partial cross-sectional view illustrating an example of a configuration of semiconductor device 102 according to the variation.

Referring to FIG. 12, semiconductor device 102 includes second step portion ST2 and third step portion ST3 inside of first step portion ST1 (close to element region DR). Each step portion is formed to surround the outer periphery of element region DR, and metal layer 30 is formed to cover sidewalls SW1 to SW3 of the step portions. However, metal layer 30 is only required to cover at least a portion of the sidewalls of the plurality of step portions, and may be formed, for example, to cover only sidewall SW3. In that case, sidewalls SW1 and SW2 are preferably covered with second insulating film 22.

In semiconductor device 102, since the plurality of step portions are formed, the occurrence of cracking and chipping is further reduced in the manufacturing process than in previously described semiconductor device 101. Accordingly, semiconductor device 102 has further improved reliability.

Third Embodiment

Method of Manufacturing Semiconductor Device

FIG. 14 is a flowchart showing an overview of a manufacturing method according to the present embodiment. Referring to FIG. 14, this manufacturing method includes a semiconductor layer preparation step (S201), a step portion formation step (S202), a first insulating film formation step (S203), a second insulating film formation step (S204), and a division step (S205). A third embodiment is different from the previously described first embodiment and its variation in that metal layer 30 is not formed, and is otherwise substantially the same as the first embodiment and its variation and thus the description thereof will not be repeated.

Figure 13:
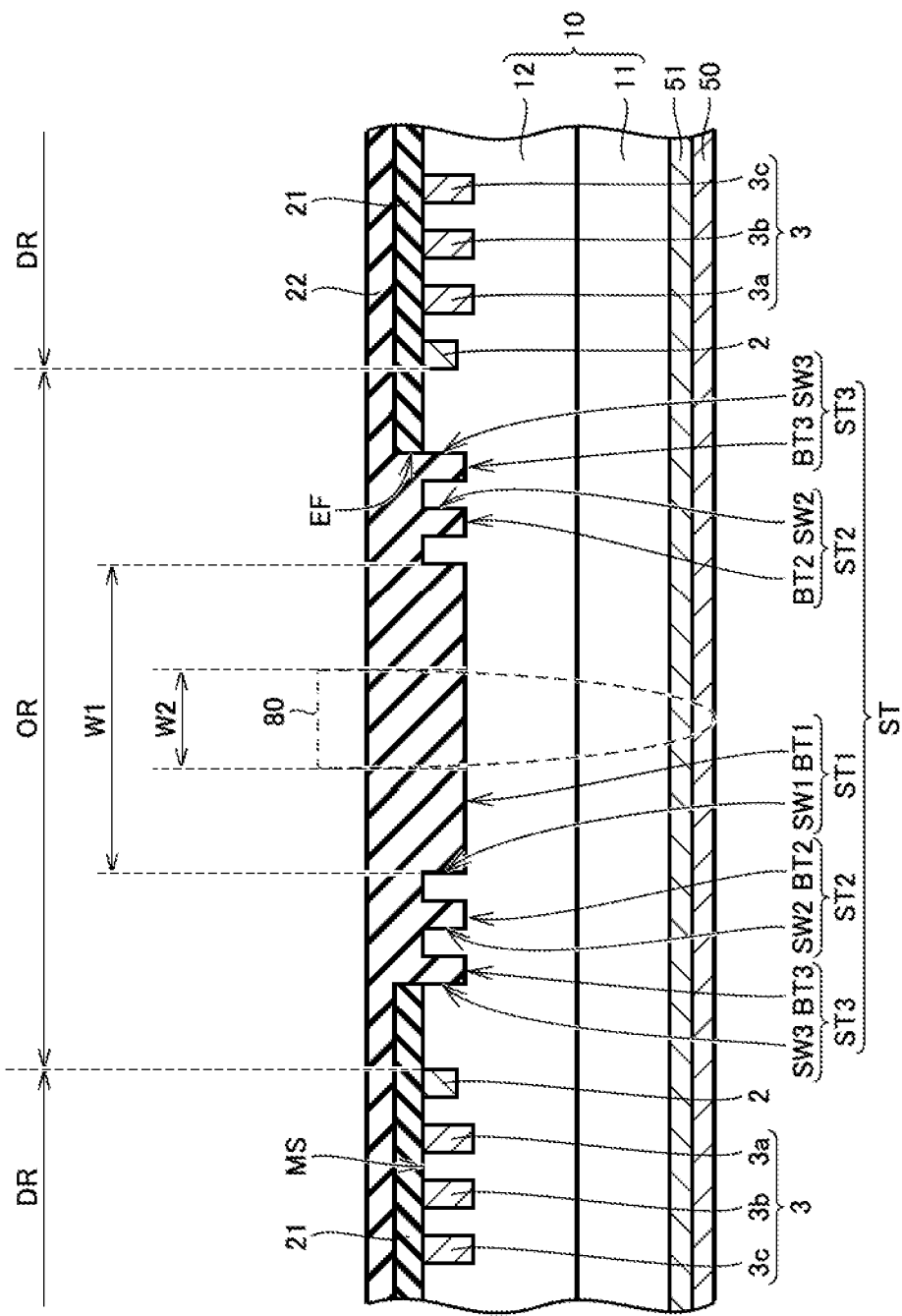
FIG. 13 is a schematic partial cross-sectional view illustrating a third embodiment of the present invention.

FIG. 13 is a schematic partial cross-sectional view illustrating the third embodiment. Referring to FIG. 13, in this manufacturing method, after semiconductor layer 10 including a wide bandgap semiconductor and having element region DR and outer peripheral region OR surrounding the outer periphery of element region DR when viewed two-dimensionally is prepared (S201), step portions ST having sidewalls SW1 to SW3 recessed downward from main surface MS in a cross section parallel to the thickness direction of semiconductor layer 10 are formed in outer peripheral region OR (S202), and then semiconductor layer 10 is divided into element regions DR by dicing blade 80 on the outside of step portion ST when viewed from element region DR (S205).

In the above manufacturing method, by forming step portion ST in outer peripheral region OR, machining stress during the dicing tends to be concentrated on step portion ST due to the notch effect. By intentionally providing the portion where cracking and chipping tend to occur in this manner, the occurrence of cracking and chipping that cause damage to element region DR can be reduced. In this manufacturing method, therefore, a wide bandgap semiconductor (SiC, GaN, AlN or diamond, for example) having hardness higher than the hardness of Si can be employed.

Referring to FIG. 13, in this manufacturing method, the plurality of step portions, namely, first step portion ST1, second step portion ST2 and third step portion ST3 are formed in outer peripheral region OR. First step portion ST1 is a groove forming dicing line W1 surrounding the outer periphery of element region DR and being wider than dicing width W2 of dicing blade 80. By utilizing the step portion as dicing line W1 in this manner, the thickness of semiconductor layer 10 to be cut is reduced, thereby decreasing the frequency of occurrence of cracking and chipping. Moreover, by forming the plurality of step portions, the occurrence of cracking and chipping that cause damage to element region DR can be more reliably reduced.

The above manufacturing method includes the step of forming first insulating film 21 on semiconductor layer 10 (S203). In this step, first insulating film 21 is preferably formed such that its end face EF is located closer to element region DR than to first step portion ST1. First insulating film 21 is a SiO$_2$ film, for example. Although a SiO$_2$ film tends to allow moisture to permeate therethrough, the entry of moisture through end face EF can be suppressed by locating end face EF of first insulating film 21 away from the cut surface (outer peripheral end face OE of outer peripheral region OR (see FIG. 16)) as described above.

The above manufacturing method includes the step of forming second insulating film 22 on first insulating film 21 (S204). In this step, second insulating film 22 is preferably formed to cover end face EF of first insulating film 21. The entry of moisture through end face EF of first insulating film 21 can thus be suppressed. Second insulating film 22 is desirably made of a material having high moisture resistance. Examples of such materials include SiN and SiON.

Referring to FIG. 13, second insulating film 22 is preferably formed to cover sidewall SW1 of first step portion ST1 and at least a portion of bottom BT1 continuous therewith. The scattering of debris due to chipping can thus be suppressed. Second insulating film 22 further preferably covers the sidewalls and bottoms of second step portion ST2 and third step portion ST3 as well.

Fourth Embodiment

Semiconductor Device

FIG. 15 is a schematic plan view illustrating one example of a configuration of a semiconductor device according to the present embodiment, and FIG. 16 is a schematic partial cross-sectional view along the line XVI-XVI in FIG. 15. A semiconductor device 201 according to a fourth embodiment can be manufactured with the manufacturing method described in the third embodiment. The fourth embodiment is different from the previously described second embodiment and its variation in that metal layer 30 is not formed, and is otherwise substantially the same as the second embodiment and its variation and thus the description thereof will not be repeated.

Referring to FIGS. 15 and 16, semiconductor device 201 includes semiconductor layer 10 including a wide bandgap semiconductor and having element region DR and outer peripheral region OR surrounding the outer periphery of element region DR when viewed two-dimensionally, and step portions ST formed in outer peripheral region OR and surrounding the outer periphery of element region DR. In a cross section parallel to the thickness direction of semiconductor layer 10, step portions ST have sidewalls SW1 to SW3 recessed downward from main surface MS of element region DR.

In outer peripheral region OR, semiconductor device 201 includes step portions ST having sidewalls SW1 to SW3 recessed downward from main surface MS. Accordingly, semiconductor device 201 can be divided from a wafer while the occurrence of cracking and chipping is reduced. Therefore, semiconductor device 201 has high reliability and can be manufactured at a high yield.

In addition, semiconductor device 201 includes a wide bandgap semiconductor such as SiC, GaN, AlN or diamond. Therefore, semiconductor device 201 is high in breakdown voltage, low in power consumption and is able to operate fast.

Referring to FIG. 16, semiconductor device 201 includes the plurality of step portions, namely, first step portion ST1, second step portion ST2 and third step portion ST3 in outer peripheral region OR. Consequently, the frequency of occurrence of cracking and the like that cause damage to element region DR can be further decreased.

In semiconductor device 201, an inner peripheral surface including sidewall SW1 of first step portion ST1 is continuous with outer peripheral end face OE of outer peripheral region OR. This shows that first step portion ST1 was originally a groove forming a dicing line. Accordingly, the thickness of semiconductor layer 10 cut by the dicing is smaller than the thickness of the other portions, thus further decreasing the frequency of occurrence of cracking and chipping during the dicing.

Semiconductor device 201 includes first insulating film 21 on semiconductor layer 10, with its end face EF being located closer to element region DR than to step portion ST. First insulating film 21 is a SiO$_2$ film, for example. Although a SiO$_2$ film tends to allow moisture to permeate therethrough, the entry of moisture through end face EF can be suppressed by locating end face EF of first insulating film 21 away from the cut surface (outer peripheral end face OE of outer peripheral region OR) as described above.

Semiconductor device 201 includes second insulating film 22 on first insulating film 21, and second insulating film 22 covers end face EF of first insulating film 21. Consequently, the entry of moisture through end face EF of first insulating film 21 can be suppressed. Second insulating film 22 is desirably made of a material having high moisture resistance. Examples of such materials include SiN and SiON.

Second insulating film 22 preferably covers at least a portion of bottoms BT1 to BT3 of step portions ST. The scattering of debris due to chipping can thus be suppressed, and the moisture resistance of semiconductor device 201 can be increased.

CLAUSE

The embodiment of the present invention disclosed in the third embodiment will be listed and described in the following [Clause 1] to [Clause 9].

Clause 1

A method of manufacturing a semiconductor device, comprising the steps of: preparing a semiconductor layer including a wide bandgap semiconductor, the semiconductor layer having an element region and an outer peripheral region surrounding an outer periphery of the element region when viewed two-dimensionally; and forming a step portion surrounding the outer periphery of the element region in the outer peripheral region, the step portion having a sidewall recessed downward from a main surface of the element region in a cross section parallel to a thickness direction of the semiconductor layer, the method further comprising the step of dividing the semiconductor layer into the element regions on an outside of the step portion when viewed from the element region.

In [Clause 1] above, by forming step portion ST in outer peripheral region OR, machining stress during the dicing tends to be concentrated on step portion ST due to the notch effect. By intentionally providing the portion where cracking and chipping tend to occur in this manner, the occurrence of cracking and chipping that cause damage to element region DR can be reduced.

Clause 2

The method of manufacturing a semiconductor device according to [Clause 1] above, further comprising the step of forming a first insulating film on the semiconductor layer, wherein an end face of the first insulating film is located closer to the element region than to the step portion.

By locating end face EF of first insulating film 21 away from the cut surface (outer peripheral end face OE of outer peripheral region OR), the entry of moisture through end face EF can be suppressed.

Clause 3

The method of manufacturing a semiconductor device according to [Clause 1] or [Clause 2] above, wherein the dividing step includes the step of dividing the semiconductor layer by a dicing blade, and the step portion is a groove forming a dicing line surrounding the outer periphery and being wider than a dicing width of the dicing blade.

By utilizing step portion ST as dicing line W1, the thickness of semiconductor layer 10 to be cut is reduced, thereby decreasing the frequency of occurrence of cracking and chipping.

Clause 4

The method of manufacturing a semiconductor device according to any one of [Clause 1] to [Clause 3] above, wherein the wide bandgap semiconductor includes silicon carbide, gallium nitride, aluminum nitride or diamond.

According to the manufacturing method of [Clause 1] above, even the semiconductor layer including these wide bandgap semiconductors having high hardness can be divided while the occurrence of cracking and chipping is reduced.

Clause 5

The method of manufacturing a semiconductor device according to [Clause 2] above, further comprising the step of forming a second insulating film on the first insulating film, wherein the second insulating film is formed to cover the end face of the first insulating film.

According to [Clause 5] above, the entry of moisture through end face EF of first insulating film 21 can be suppressed.

Clause 6

The method of manufacturing a semiconductor device according to [Clause 5] above, wherein the step portion further has a bottom continuous with the sidewall, and the second insulating film is formed to cover at least a portion of the bottom.

According to [Clause 6] above, the scattering of debris due to chipping can be suppressed.

Clause 7

The method of manufacturing a semiconductor device according to any one of [Clause 2], [Clause 5] and [Clause 6] above, wherein the first insulating film includes silicon dioxide.

According to [Clause 2] and the like above, the entry of moisture through end face EF can be reduced, thus allowing the use of $SiO_2$ that tends to allow moisture to permeate therethrough.

Clause 8

The method of manufacturing a semiconductor device according to any one of [Clause 5] to [Clause 7] above, wherein the second insulating film includes at least one of silicon nitride and silicon oxynitride.

Since SiN and SiON have high moisture resistance, the entry of moisture can be more reliably blocked according to [Clause 8] above.

Clause 9

The method of manufacturing a semiconductor device according to any one of [Clause 1] to [Clause 8] above, wherein a plurality of the step portions are formed.

According to [Clause 9] above, element region DR can be reliably protected against cracking and chipping.

The embodiment of the present invention disclosed in the fourth embodiment will be listed and described in the following [Clause 10] to [Clause 18].

Clause 10

A semiconductor device comprising: a semiconductor layer including a wide bandgap semiconductor, the semiconductor layer having an element region and an outer peripheral region surrounding an outer periphery of the element region when viewed two-dimensionally; and step portion formed in the outer peripheral region and surrounding the outer periphery of the element region, the step portion having a sidewall recessed downward from a main surface of the element region in a cross section parallel to a thickness direction of the semiconductor layer.

The semiconductor device of [Clause 10] above includes step portion ST surrounding the outer periphery of element region DR. Consequently, the semiconductor device can be manufactured while the occurrence of cracking and chipping is reduced during the dicing, and therefore has high reliability.

Clause 11

The semiconductor device according to [Clause 10] above, further comprising a first insulating film on the semiconductor layer, wherein an end face of the first insulating film is located closer to the element region than to the step portion.

By locating end face EF of first insulating film 21 away from the cut surface (outer peripheral end face OE of outer peripheral region OR) as described in [Clause 11] above, the entry of moisture through end face EF can be suppressed.

Clause 12

The semiconductor device according to [Clause 10] or [Clause 11] above, wherein an inner peripheral surface including the sidewall is continuous with an outer peripheral end face of the outer peripheral region.

The embodiment of [Clause 12] above appears when step portion ST was originally a groove forming dicing line W1. In this embodiment, the thickness of semiconductor layer 10 cut by the dicing is smaller than the thickness of the other portions, thus further decreasing the frequency of occurrence of cracking and chipping.

Clause 13

The semiconductor device according to any one of [Clause 10] to [Clause 12] above, wherein the wide bandgap semiconductor includes silicon carbide, gallium nitride, aluminum nitride or diamond.

The semiconductor device of [Clause 13] above can be high in breakdown voltage, low in power consumption and operate fast based on the properties of these wide bandgap semiconductors.

Clause 14

The semiconductor device according to [Clause 11] above, further comprising a second insulating film formed on the first insulating film, wherein the second insulating film covers the end face of the first insulating film.

By forming the insulating films as a two-layer structure and covering end face EF of first insulating film 21 with second insulating film 22, the entry of moisture into element region DR can be suppressed.

Clause 15

The semiconductor device according to [Clause 14] above, wherein the step portion further has a bottom continuous with the sidewall, and the second insulating film covers at least a portion of the bottom.

According to [Clause 15] above, the scattering of debris due to chipping can be suppressed, and the entry of moisture into element region DR can be blocked.

Clause 16

The semiconductor device according to any one of [Clause 11], [Clause 14] and [Clause 15] above, wherein the first insulating film includes silicon dioxide.

According to the embodiment of [Clause 11] and the like above, the entry of moisture through first insulating film 21 can be suppressed, thus allowing the use of SiO₂ as the first insulating film.

Clause 17

The semiconductor device according to any one of [Clause 14] to [Clause 16] above, wherein the second insulating film includes at least one of silicon nitride and silicon oxynitride.

Since SiN and SiON have high moisture resistance, second insulating film 22 including these elements can more reliably suppress the entry of moisture into element region DR.

Clause 18

The semiconductor device according to any one of [Clause 10] to [Clause 17] above, comprising a plurality of the step portions.

According to [Clause 18] above, the frequency of occurrence of cracking and the like that cause damage to element region DR can be further decreased.

Although one embodiment of the present invention has been described above, it is originally intended to appropriately combine the configurations of the embodiments described above.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A semiconductor device comprising:
    a semiconductor layer including a single-crystal substrate and an epitaxial layer, said epitaxial layer being formed on said single-crystal substrate, said single-crystal substrate and said epitaxial layer being made of a wide bandgap semiconductor, said semiconductor layer having an element region and an outer peripheral region surrounding an entirety of an outer periphery of said element region when viewed two-dimensionally in a plan view of the semiconductor device;
    a step portion formed in said outer peripheral region and surrounding said entirety of said outer periphery of said element region; and
    a metal layer formed along said step portion,
    said step portion having a sidewall recessed downward from a main surface of said element region in a cross section parallel to a thickness direction of said semiconductor layer, said metal layer extending to cover at least a portion of said sidewall,
    said metal layer surrounding said entirety of said outer periphery of said element region,
    said step portion further having a bottom continuous with said sidewall, and
    said bottom being located in said epitaxial layer,
    wherein the metal layer is in direct physical contact with the epitaxial layer.

2. The semiconductor device according to claim 1, further comprising a first insulating film formed on said semiconductor layer, wherein
    said metal layer covers an end face of said first insulating film.
3. The semiconductor device according to claim 1, wherein
    an inner peripheral surface including said sidewall is continuous with an outer peripheral end face of said outer peripheral region.
4. The semiconductor device according to claim 1, wherein
    said metal layer includes at least one of aluminum, titanium and copper.
5. The semiconductor device according to claim 1, wherein
    said metal layer covers a portion of said bottom.
6. The semiconductor device according to claim 1, wherein
    said wide bandgap semiconductor includes silicon carbide, gallium nitride, aluminum nitride or diamond.
7. The semiconductor device according to claim 2, further comprising a second insulating film formed on said first insulating film.
8. The semiconductor device according to claim 2, wherein
    said first insulating film includes silicon dioxide.
9. The semiconductor device according to claim 7, wherein
    said second insulating film includes at least one of silicon nitride and silicon oxynitride.
10. The semiconductor device according to claim 2, wherein
    said end face of said first insulating film is located closer to said element region than to said step portion.
11. The semiconductor device according to claim 7, wherein said second insulating film extends on an upper surface of said metal layer.
12. A semiconductor device comprising:
    a semiconductor layer including a single-crystal substrate and an epitaxial layer, said epitaxial layer being formed on said single-crystal substrate, said single-crystal substrate and said epitaxial layer being made of a wide bandgap semiconductor, said semiconductor layer having an element region and an outer peripheral region surrounding an outer periphery of said element region when viewed two-dimensionally;
    a step portion formed in said outer peripheral region and surrounding said outer periphery of said element region;
    a metal layer formed along said step portion;
    said step portion having a sidewall recessed downward from a main surface of said element region in a cross section parallel to a thickness direction of said semiconductor layer, said metal layer extending to cover at least a portion of said sidewall,
    said step portion further having a bottom continuous with said sidewall, and
    said bottom being located in said epitaxial layer,
    wherein the metal layer is in direct physical contact with the epitaxial layer; and
    a second insulating film formed on said first insulating film, wherein said second insulating film extends on an upper surface of said metal layer.

* * * * *